United States Patent [19]
Johnson

[11] Patent Number: 5,808,489
[45] Date of Patent: Sep. 15, 1998

[54] HIGH SPEED A/D CONVERTER AND SLEW CONTROLLED PULSE DETECTOR

[75] Inventor: Timothy Joe Johnson, Palm Bay, Fla.

[73] Assignee: Harris Corporation, Melbourne, Fla.

[21] Appl. No.: 269,470

[22] Filed: Jun. 30, 1994

[51] Int. Cl.[6] .................................................. H03K 5/153
[52] U.S. Cl. ................................ 327/77; 327/18; 327/205
[58] Field of Search ................................. 327/77, 18, 205

[56] References Cited

U.S. PATENT DOCUMENTS

| | | | |
|---|---|---|---|
| 3,392,386 | 7/1968 | Evans et al. | 343/5 |
| 3,725,673 | 4/1973 | Frederiksen et al. | 307/235 R |
| 5,083,124 | 1/1992 | Nordstrom | 340/853 |
| 5,099,142 | 3/1992 | Barre | 307/272.2 |
| 5,329,173 | 7/1994 | Murakami et al. | 327/205 |
| 5,367,203 | 11/1994 | Plummer | 327/77 |

FOREIGN PATENT DOCUMENTS

| | | |
|---|---|---|
| 0 345 621 | 12/1989 | European Pat. Off. . |
| WO-A-91 12668 | 8/1991 | European Pat. Off. . |
| 2 062 996 | 5/1981 | United Kingdom . |

*Primary Examiner*—Margaret Rose Wambach
*Attorney, Agent, or Firm*—Nixon, Hargrave, Devans & Doyle

[57] ABSTRACT

A pulse detecting system 1 has a high speed A/D converter 10 and a slew controlled pulse detector 110. The A/D converter 10 has large hysteresis for holding the converted digital value of an input signal $V_{PULSE}$ until the A/D converter 10 is reset. The slew controlled pulse detector 110 limits the slew rate of large amplitude pulse to correct arrival errors and provide an output signal $V_{AT}$ that more accurately represents the arrival time of the input pulse signal, $V_{PULSE}$.

8 Claims, 9 Drawing Sheets

HIGH SPEED A/D CONVERTER AND SLEW CONTROLLED PULSE DETECTOR

FIELD OF THE INVENTION

This invention relates to pulse detectors, in particular, pulse detectors with analog to digital (A/D convertors and slew rate detection circuits.

Optical and other electromagnetic pulses are used to transmit information and to detect objects at a distance from the transmitter. The detector receives pluses that have traveled through one or more mediums, e.g., optical fibers, air, water, or space. The transmitted pulses are affected by the medium and the process of transmission. Often the medium will result in a dispersion of the pulse, thereby attenuating its amplitude and spreading its energy over a wider pulse width than the original pulse width. Pulses are also affected by reflection from a target, as in the case of laser range finder pulses and radar. Some targets have low reflectivity and will attenuate and disperse a pulse. Other targets have high reflectivity or may be close to the transmitter so the detected pulse has an amplitude with little attenuation and a pulse width that is only slightly dispersed. As such, the pulse detector must detect pulses of various amplitudes and of various dispersions.

Pulse detectors use an A/D converter to convert the amplitude of the detected pulse into a digital signal that can be processed by further digital circuitry to extract information from the detected pulse. It is also desireable to measure other characteristics of the pulse including arrival time and pulse width. Since many of the pulses are generated at high frequencies, the A/D converter must complete conversion of the pulse before the next pulse arrives. So, the A/D converter has to be faster in operation than the frequency of the pulse. Since pulses in optical system often exceed 100 megahertz, a high speed A/D converter is required.

One type of A/D converter operates on a continual basis. Such continual type converters generally are used for converting signals having a relatively slow frequency. It is possible to increase the speed of continual type converters, however an increase in speed necessarily requires a large increase in power, which is undesirable.

Another type of A/D converter is a flash converter with a clocked architecture. In such converters, the input signal is sampled and held until the data is converted. Flash converters, however, require precise knowledge of when the data arrives. Flash converters are synchronized to the incoming data. Such clocked flash converters are not suitable for converting analog signals that arrive assynchronously or at a random time.

Another problem encountered is the determination of the arrival time of random, high speed pulses. Arrival time is measured by using a threshold value. When the incoming pulse crosses the threshold, the time of threshold crossing is taken as an indication that a pulse has arrive. So long as all pulses have the same dispersion, the threshold crossing technique will give an acceptable value of the arrival time. However, such measurement techniques present problems when pulses are not symmetrical or when the pulse is subject to transmission medium distortion. Another problem arises due to the amplitude of a pulse.

Pulses generated by lasers or other optical communication systems normally are Gaussian pulses and have a center point that is well defined by their width. However, the amplitude of the pulse will vary depending upon the medium in which it is transmitted, including the dispersion within the medium and the distance of transmission. A typical Gaussian pulse generated optically will be attenuated by cloud cover or defects in the optical fiber which will tend to disperse the pulse as a function of distance.

As such, a detector will receive pulses of various widths and different heights. Since it is virtually impossible to detect the peak of a given pulse, then the presence of a pulse is normally detected by crossing of the threshold. A problem with detecting pulses using such a technique is illustrated with reference to prior art FIG. 4a. That figure shows two pulses A, B that arrive at the time but will appear to a threshold detector to arrive at different times.

Figure 4A:
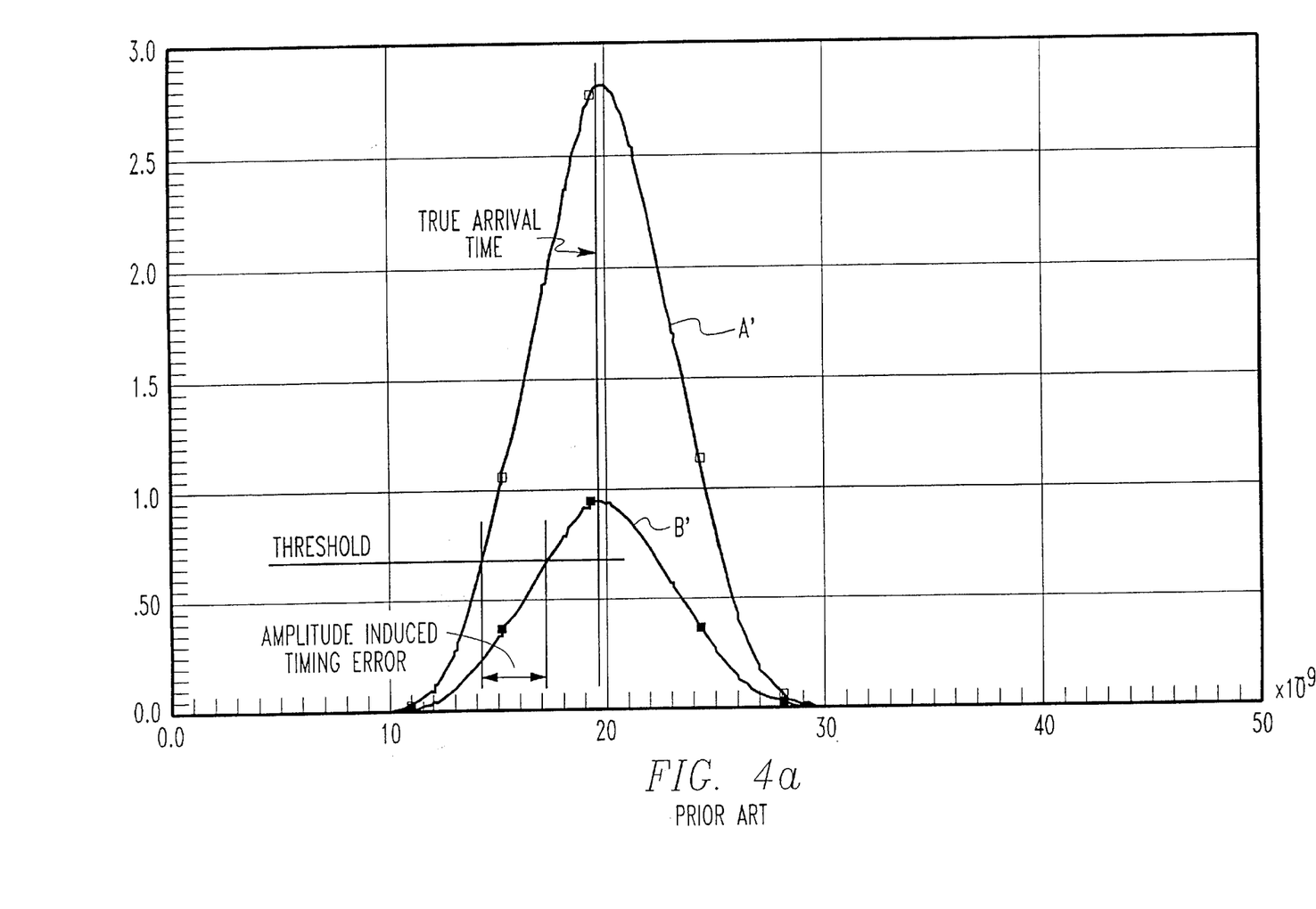
FIGS. 4A and 4B are a graphic representation of the error correction achieved by the slew controlled pulse detector.

Pulse A is well defined, has a steep rise and has a peak value of about 3.0 volts. Pulse B has a less steep rise and has a peak value of about 0.9 volts. The threshold voltage is 750 millivolts and the pulses will trigger the threshold at different times. Pulse A appears to arrive at a time T1 and Pulse B appears to arrive T2. The difference, T2−T1, is the amplitude induced error. The amplitudes of the respective pulses A, B induce error since the different amplitudes give an erroneous indication of the arrival time of the pulses. The larger pulse A appears to arrive substantially earlier than the smaller pulse B when, in fact, both pulses arrive at exactly the same time.

SUMMARY OF THE INVENTION

The invention provides a combined A/D converter and slew limiting pulse detector that converts high speed pulse signals into digital signals and gives an output signal representative of a more accurate arrival time of the converted, incoming pulses. The A/D converter has an architecture that includes a plurality of comparators with built-in hysteresis. The comparators have a bias circuit which sets all the comparators on the edge of their trigger voltage. Each comparator also has a reset input terminal. The smallest input above the trigger voltage of the comparator will cause the comparator to trigger as the voltage on the input cross the trigger voltage level. Each comparator is constructed with relatively large hysteresis so that when the pulse falls, the comparator holds its value. In effect, a pulse applied to the row of comparators is captured until the comparators are reset by applying a reset signal to their reset input. It is not necessary to synchronize the operation of the A/D Converter with the incoming pulses. All that is required is knowledge of the range of frequencies of the input pulses. Once that is known, the reset signal can be set to operate in a time longer than the expected pulse width but shorter than the pulse frequency. So, each input pulse is converted to a digital output and the comparator is reset before the next pulse arrives. As such, the reset timing can be based upon a standard cycle time. Another alternative is to reset the comparators after a predetermined amount of time that is greater than the width of the pulse. So, if a pulse was 5 nanoseconds wide than the comparator would be reset at a time greater than 5 nanoseconds, e.g. 10 nanoseconds.

The slew rate limiting pulse detector of the invention limits the error induced by the amplitude of the incoming pulses. The slew rate limiting pulse detector includes a comparator amplifier with an input terminal for receiving input pulses of various heights. The comparator is set with a predetermined, programmable threshold for detecting pulses of a minimum amplitude. The amplifier has a controlled slew rate. The slew rate is also programmable but may be fixed. The slew rate of the amplifier is preferably set to have a rate fast enough to detect pulses of the smallest allowable magnitude. By controlling the slew rate to detecting pulses of the smallest allowable magnitude, errors introduced by sharper, higher amplitude pulses, will be limited. The slew rate control will, in effect, dampen the rise time of the pulses. So, large amplitude pulses will appear to arrive later in time, e.g. at a time closer to the arrival time indicated by a the lower amplitude pulses. Thus, the error introduced by the amplitude of incoming pulses will be substantially reduced. The slew rate is controlled by modulating the current through a capacitor which sets the slew rate of the comparator. As such, one may modulate the capacitor or the capacitor's value, or the current through the capacitor. In either case, it is the product of the current and the capacitance that sets the slew rate for the amplifier.

DETAILED DESCRIPTION

Figure 1:
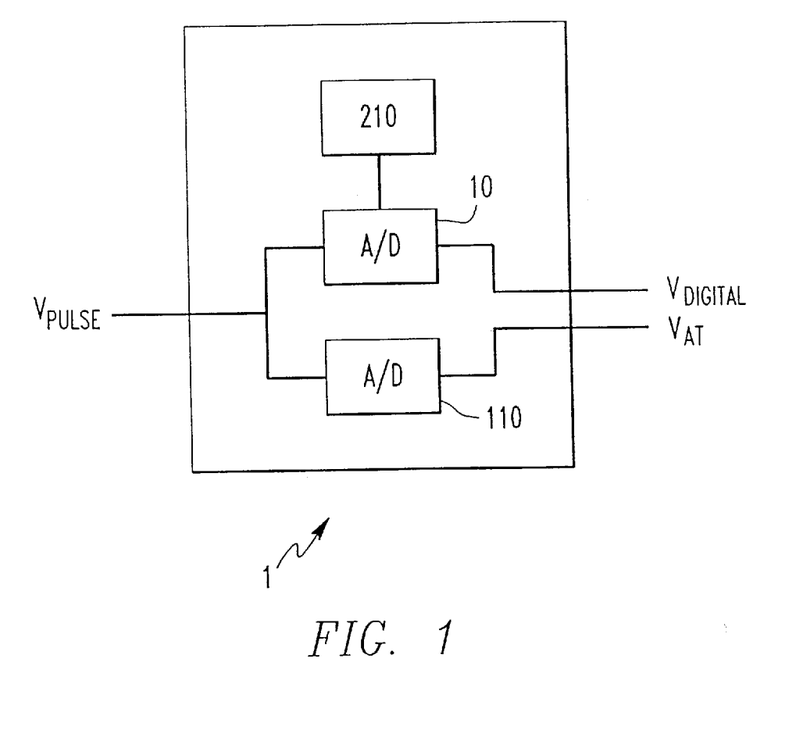
FIG. 1 is a system level schematic of the invention.

With reference to FIG. 1, there is a general description of the system and circuitry covered by the invention. A pulse in the form of a voltage pulse identified as $V_{PULSE}$ is input to the A/D arrival time pulse detector system 1. The input, $V_{PULSE}$ is simultaneously applied to an A/D converter 10 and to an arrival time detector 110. The A/D converter 10 has an output $V_{DIGITAL}$ that is a binary signal representative of the maximum value of the $V_{PULSE}$. The second output, $V_{AT}$ has also a binary signal representative of arrival time of the signal $V_{PULSE}$ at the system 1.

Figure 2:
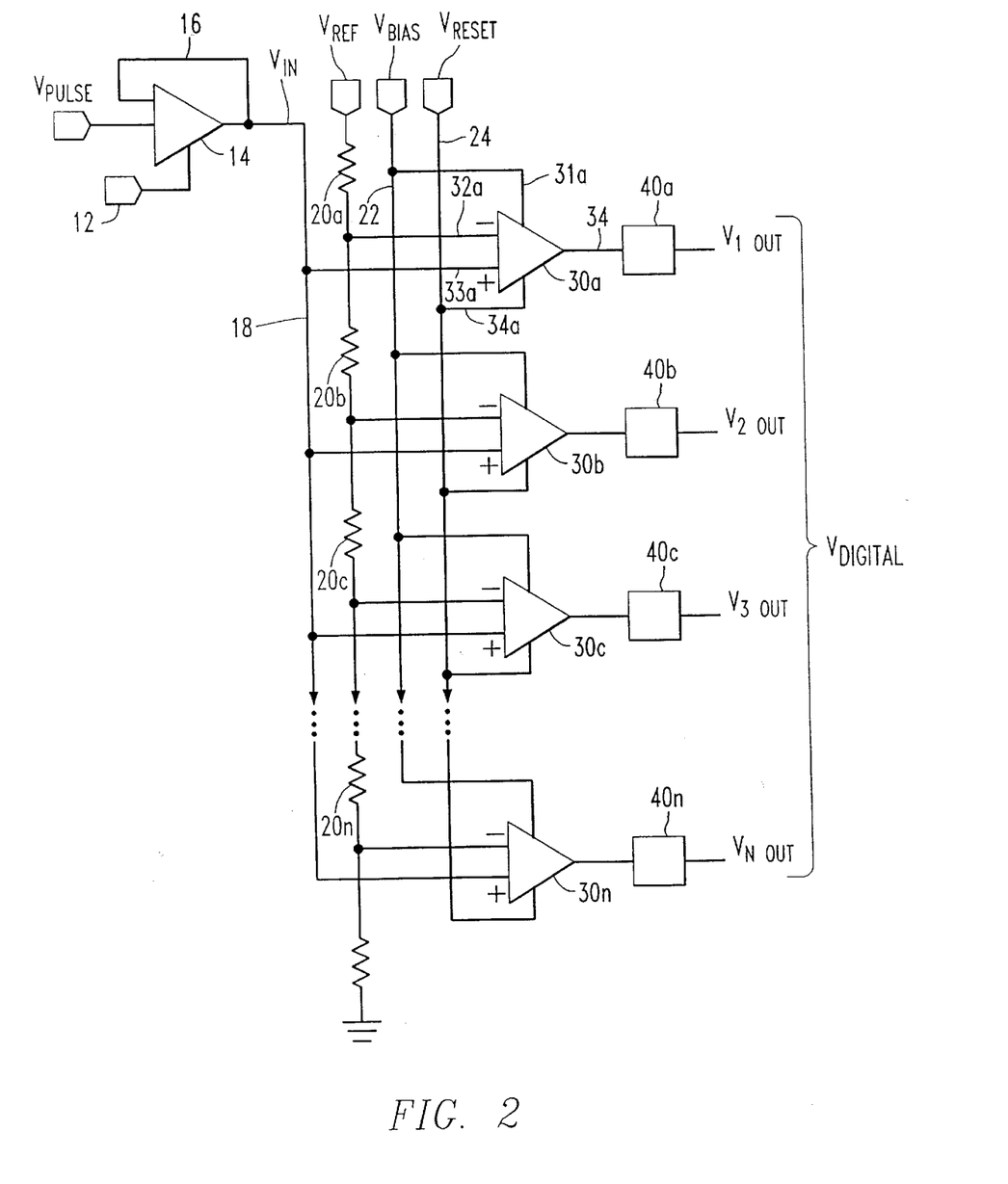
FIG. 2 is a schematic of the A/D converter.

Turning to FIG. 2, the A/D convertor 10 includes a buffer amplifier 14 and a plurality of comparators 30. The signal $V_{PULSE}$ is input to a buffer amplifier 14. The buffer amplifier 14 has a feedback connection 16 to another input and has a bias input 12. The output of buffer amplifier 14 is the signal $V_{IN}$. The signal $V_{IN}$ is applied to line 18. Coupled to line 18 are n numbers of comparators 30a, 30b, 30c . . . 30n. A string of n resistors 20a, 20b, 20c . . . 20n each of selectable value are connected to the negative inputs of the comparators 30n. Connected to one end of the string of resistors 20n is a voltage of a known value, $V_{REF}$. The value of $V_{REF}$ is selected to be compatible with the expected value of the input signal $V_{PULSE}$. As such, if the maximum expected amplitude of $V_{PULSE}$ is 3 volts, then the reference voltage $V_{REF}$ is greater than 3 volts e.g. 4 volts. The number of comparators 30n and selectable resistors 20n depends upon the degree of accuracy desired from the A/D converter 10. The preferred embodiment of the invention has 3+bit accuracy and thus there are 14 comparator 30 resistors 20a. Each comparator 30 has a bias input 31. A bias voltage $V_{BIAS}$ is coupled via line 22 to each of the bias inputs 31n of the comparators 30n. Each comparator 30 has a further reset input 34. A reset signal $V_{RESET}$ is coupled via line 24 to each of the reset inputs 34n of the comparators 30n. In effect, when a voltage $V_{IN}$ appears on line 18, it is sequentially compared across comparators 30n in increments of $V_{REF/N}$. If the cumulative voltage drop at any one comparator, e.g. comparator 30c equals or exceeds the voltage dropped across the cumulative resistors 20(a), (b), (c), then the output of the comparator will be high and will represent 1-bit of an n bit word. As such, the last comparator 30n represents the most significant bit in the A/D conversion. The outputs of comparators 30n are fed into a logic level shifters 40n. Logic level shifters 40n provide output digital logic signals compatible with circuit processing. Taken together, the respective outputs $V_{1\ OUT}, V_{2\ OUT} \ldots V_{N\ OUT}$ provide the digital output $V_{DIGITAL}$ of the A/D converter 10.

In operation, an input signal $V_{PULSE}$ is applied via buffer 14 to input line 18. Each comparator 30 is set at its edge of triggering by its bias input 31. Normally the comparator outputs 34 would tend to follow the pulse and thus would fall after the pulse passes its peak. However, each comparator 30n includes a circuit which increases the hysteresis of the comparator to delay the comparator from following the pulse as the pulse falls in amplitude. After a predetermined reset time set by a counter or cycle timer 210 (see FIG. 1), a reset signal $V_{RESET}$ is applied to reset line 24 and the A/D converter is reset so that its output is set to zero.

Figure 3:
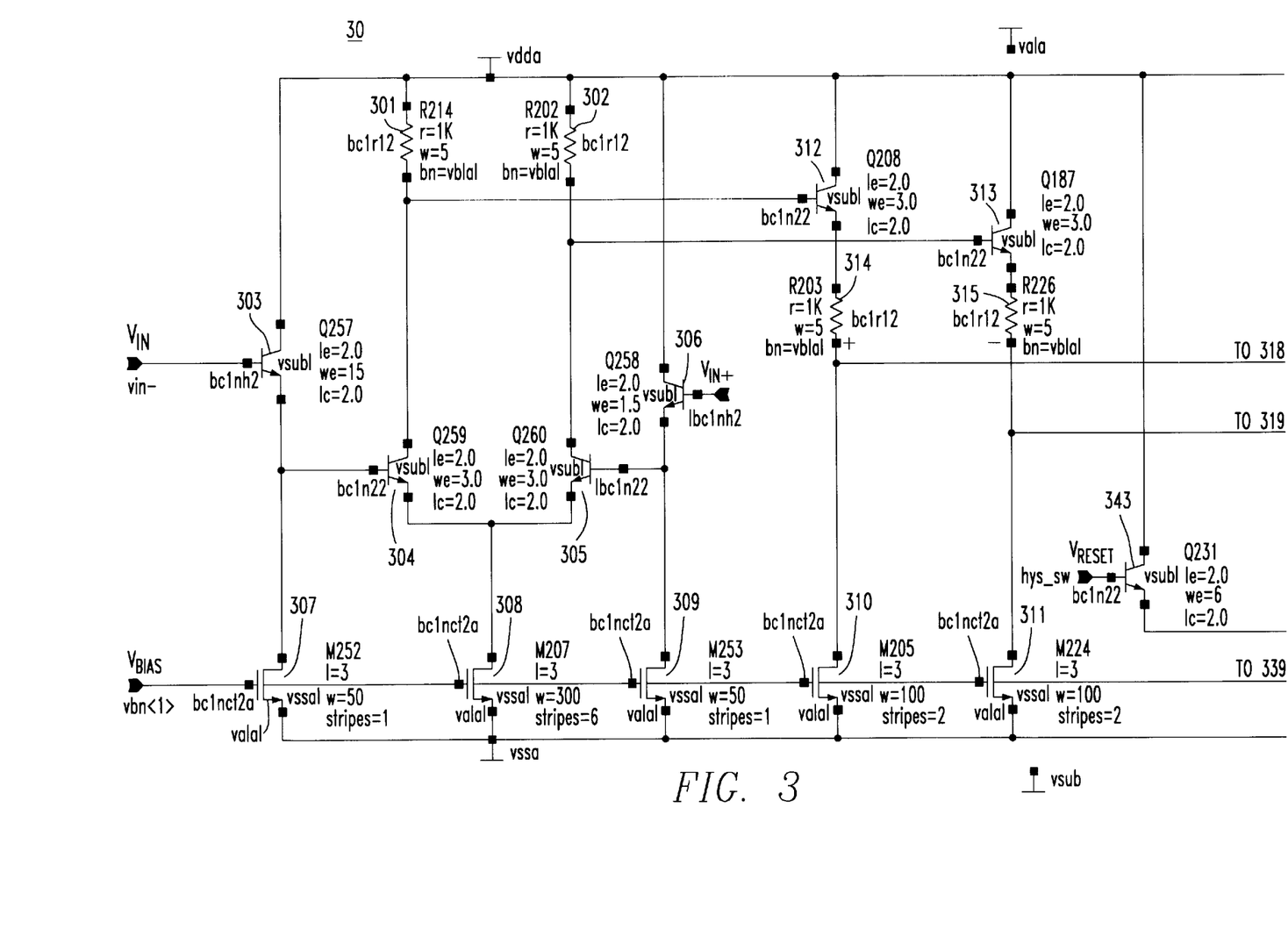
FIG. 3 is a transistor level schematic of the A/D converter comparator.
Figure 3A:
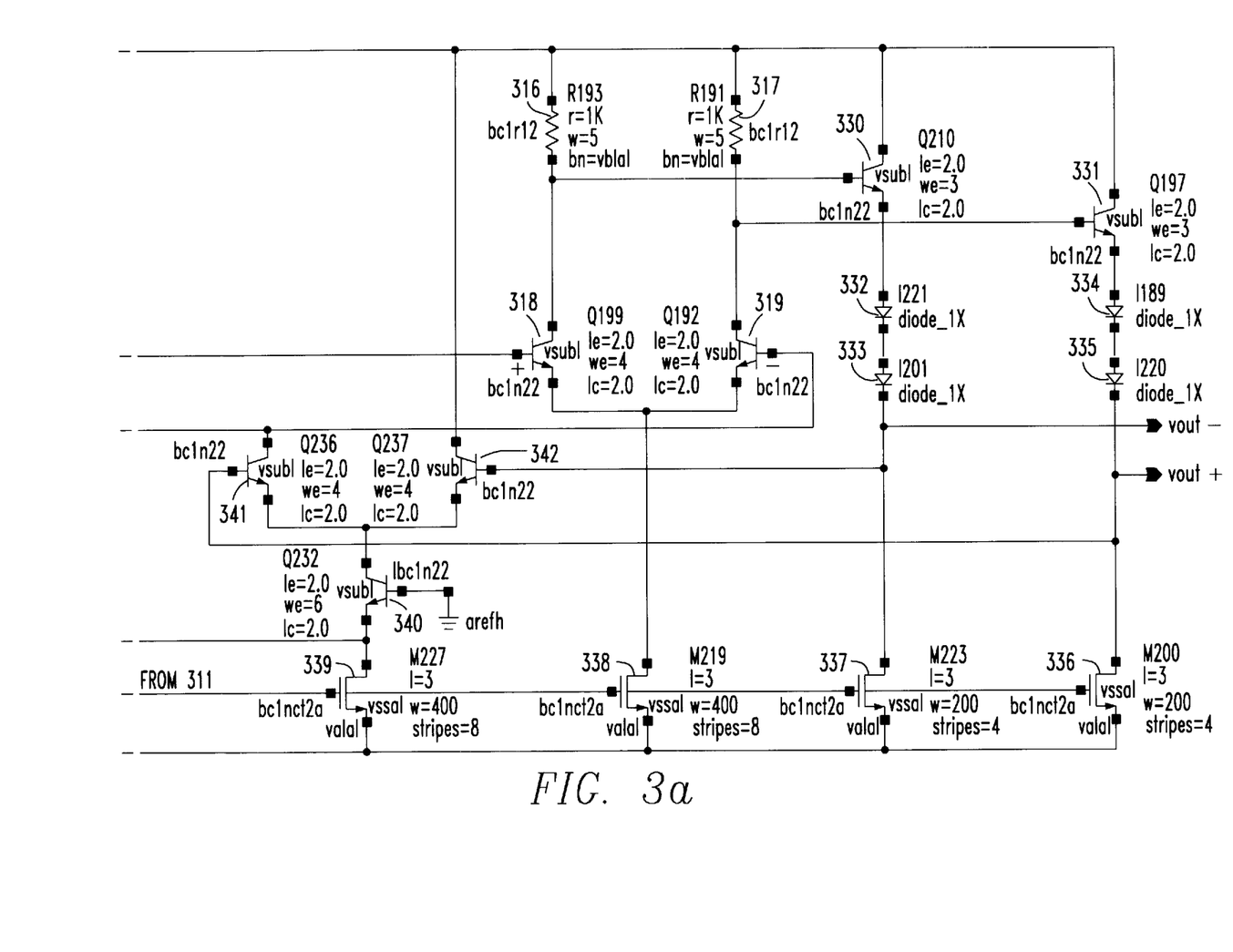

With reference to FIG. 3, a typical comparator 30 is shown. There, inputs 303 and 306 are the plus and minus inputs to the comparator 30. The plus input 303 is coupled to the comparator via a transistor 306. The minus input 306 is coupled via another transistor 303. As will be recalled from FIG. 2, the minus input 306 is coupled to a reference voltage applied to a resistor 20. As such, the plus and minus inputs 303, 306 of the comparator 30 are coupled to a first differential pair of transistors of 304 and 305. The output of the differential pair of transistors 304 and 305 is coupled via a first FET transistor 308 to ground. FET transistor 308 along with other FET transistors 307, 309, 310, 311 and 336–339 each provide a bias current as will be explained herein after. By applying a $V_{BIAS}$ to the gates of transistors 307–311 and 336–339 those FET transistors are controlled to draw a certain predetermined amount of bias current. The predetermined bias current biases the individual transistors and transistor pairs explained hereinafter.

The first differential pair 304, 305 of npn transistors are level shifters. These transistors shift the level of input voltage to a level of voltage compatible to the rest of the circuitry. A second set of differential pairs 318, 319 are coupled, respectively, to resistors 314, 315. Resistors 314 and 315 are coupled via transistors 312, 313 to the collectors of the first differential pair 304, 305. As such, the inputs 303, 306 are coupled to the respective bases of the second differential pair of npn transistors 318, 319. In effect, transistors 312, 313 are followers that couple the input differential pair 304, 305 to the operational differential pair 318, 319.

The collectors of differential pair 318, 319 are connected to the bases, respectively, of npn transistors 330, 331. Transistors 330, 331 are connected as followers. The output of transistor 330 is connected to a first pair of diodes 332, 333. The output of transistor 331 is coupled to a second pair of diodes 334, 335. The outputs of the diode pairs 332–335 are themselves connected to a third differential pair of transistors 341, 342. Diode pair 332, 333 is coupled to the output and also to the base of npn transistor 342. Diode pair 334, 335 is coupled to the minus $V_{OUTPUT}$ and also to the base of npn transistor 341. Differential pair of transistors 341, 342 provide hysteresis for the comparator 30. When the second differential pair of transistors 318, 319 triggers and the output go high, the minus output of the second differential pair is pulled down by the transistor 341. So, the outputs of the second differential pair 318, 319 will remain fixed until the comparator 30 is reset. Reset is accomplished by applying the signal $V_{RESET}$ to transistor 343. Transistor 343 turns on and this turns off the hysteresis differential pair 341, 342. That pair releases the minus output Vout and allows the comparator 30 to return to normal operation.

Figure 4B:
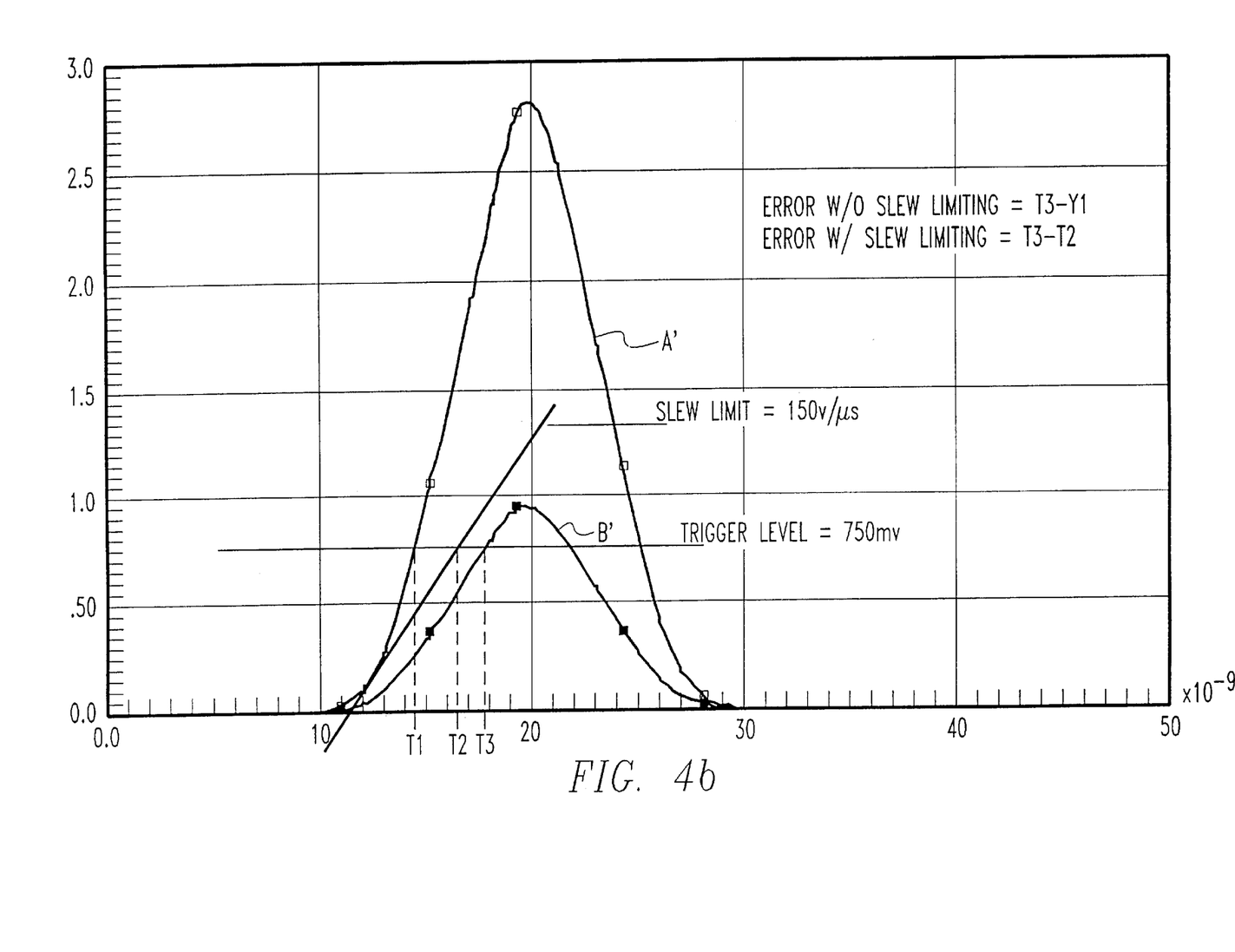

Prior to explaining the details of the slew rate limiting pulse detector 110, reference is made to FIG. 4 where the effect a slew rate control upon pulses A' and B' will be explained. FIG. 4 shows two pulses, A' and B'. The trigger level for the pulses is set at 750 millivolts. The amplitude of pulse A' is about 2.8 volts and pulse B' is approximately 0.9 volts. The slew rate of the pulse detector 110 is set at approximately 150 volts per microsecond. The arrival of either pulse A' or pulse B' is determined at the time the pulse passes the 750 mv threshold level. However, the slew rate limited pulse detector 110 has a slew rate of 150 volts per microsecond. As mentioned above, it is very difficult to predict the maximum amplitude of the detected pulse. The amplitude may be attenuated due to dispersion or may be greater than expected due to enhanced reflectivity from nearby objects. In general, systems are designed to detect pulses of minimum and maximum heights. The threshold trigger level (here 750 mv) is set to detect the lowest level of pulse available. However, the maximum level of pulse may well exceed the minimum level and thereby induce arrival time error. So, pulse A' without slew correction would appear to arrive at time T1 and pulse B' would arrive at time T3. However, with slew limit correction, the rise time of pulse A' is limited to the slope defined by the slew limit. Pulse A' is forced to follow the slew limit of 150 v/msec and will have an apparent arrival time of T2 and the error in arrival time between the two pulses is T3–T2. The slew limit of 150 v/msec can be set accurately. It has been determined that the slew limit rate of the preferred embodiment is the maximum rate of change of the smaller pulse. Thus, the slew limit shown in FIG. 4 appears to be parallel to a major portion of the rising slope of pulse B'.

Figure 5:
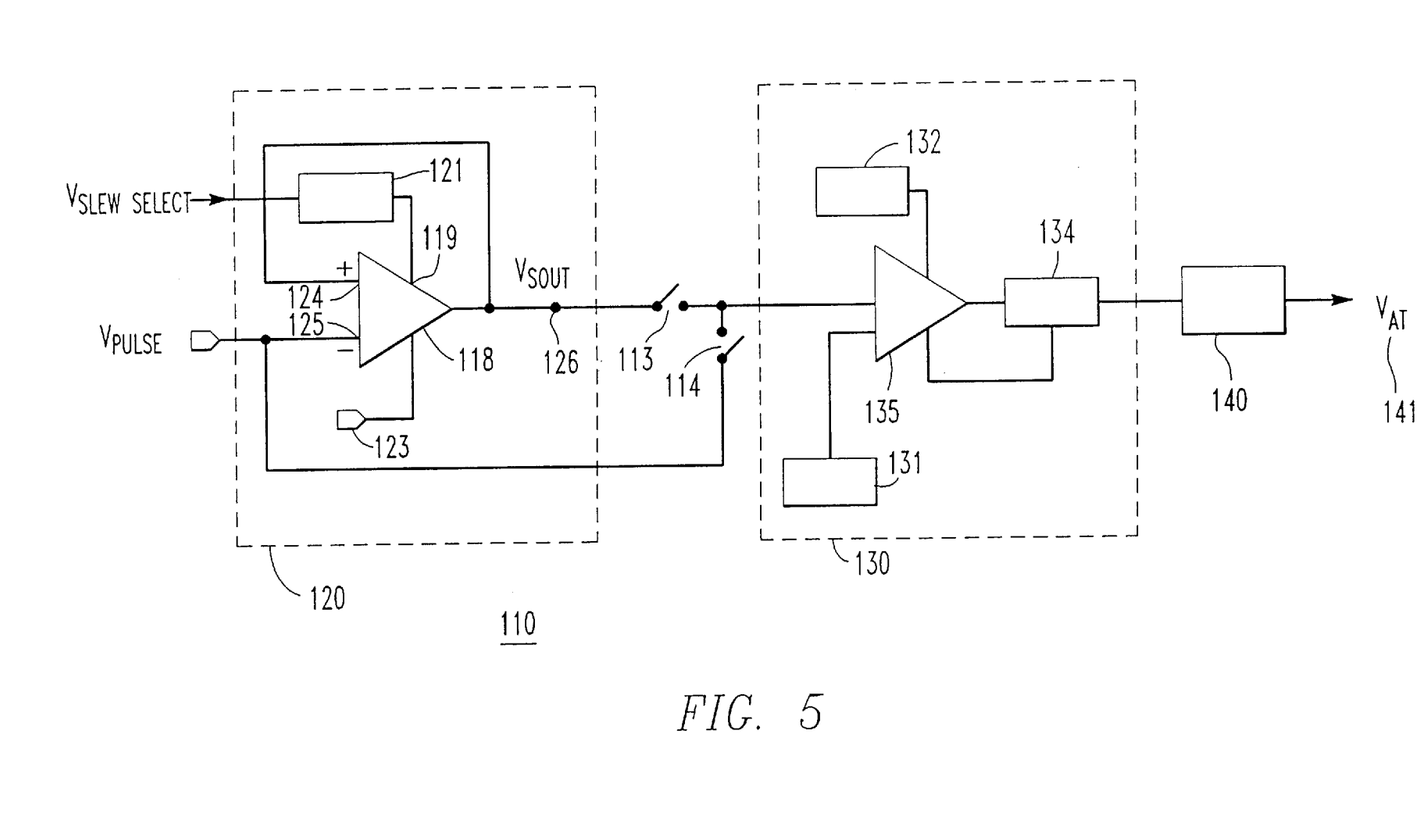
FIG. 5 is a schematic of the slew controlled pulse detector.

With reference to FIG. 5, there is shown the slew limit pulse detector 110. The input $V_{PULSE}$ is provided to a slew controlled amplifier 120. The amplifier 120 is a differential amplifier having differential inputs 124, 125, a bias input 123 and a slew limit control input 119. The slew limit control input 119 comes from a slew limit controller 121. Slew limit controller 121 comprises a network of programmable or otherwise configurable circuits which set the slew rate for the amplifier 120. Those skilled in the art are familiar with controlling the slew limit of amplifiers and a further description is not necessary to enable one skilled in the art to make claimed invention. In the preferred embodiment, the slew rate can be limited from one to four times its normal rate. In order to modulate the slew rate, the slew limit controller 121 changes the current through a capacitor (not shown) which in turn controls the current into the slew limit input 119 of the slew limit amplifier 120. The output of the slew limit amplifier, $V_{SOUT}$ at mode 126, is input into a comparator 130. The comparator 130 had an amplifier 135 with an input from a programmable reference generator 131 and a reset controller 132. It should be noted that the input $V_{PULSE}$ may bypass the amplifier 120 and be applied directly to the comparator 130. This is accomplished by operation of one or more of the switches 113, 114. The output of amplifier 135 is coupled into an output controller 134 which in turn has a feedback connection to amplifier 135. The output controller 134 is coupled to a timer 140. The output of timer 140 provides a signal $V_{AT}$ which is representative of the arrival time of the $V_{PULSE}$ signal. The timer 140 is a high speed counter. Its output $V_{AT}$ is a logical level signal that includes binary representation of the arrival time of the signal $V_{PULSE}$. Comparator 130 has programmable bias input 131 for a setting of threshold level. Thus, with the slew limit impulse detector 110, one may select different limits of slew rate as well as different threshold limits of pulses. While selection and programmability is a desireable feature, the invention can also be practiced with fixed limits of slew rate and threshold, if desired. Circuits for selecting the threshold level of detection is also well known to those skilled in the art and need not be further described herein.

Figure 6:
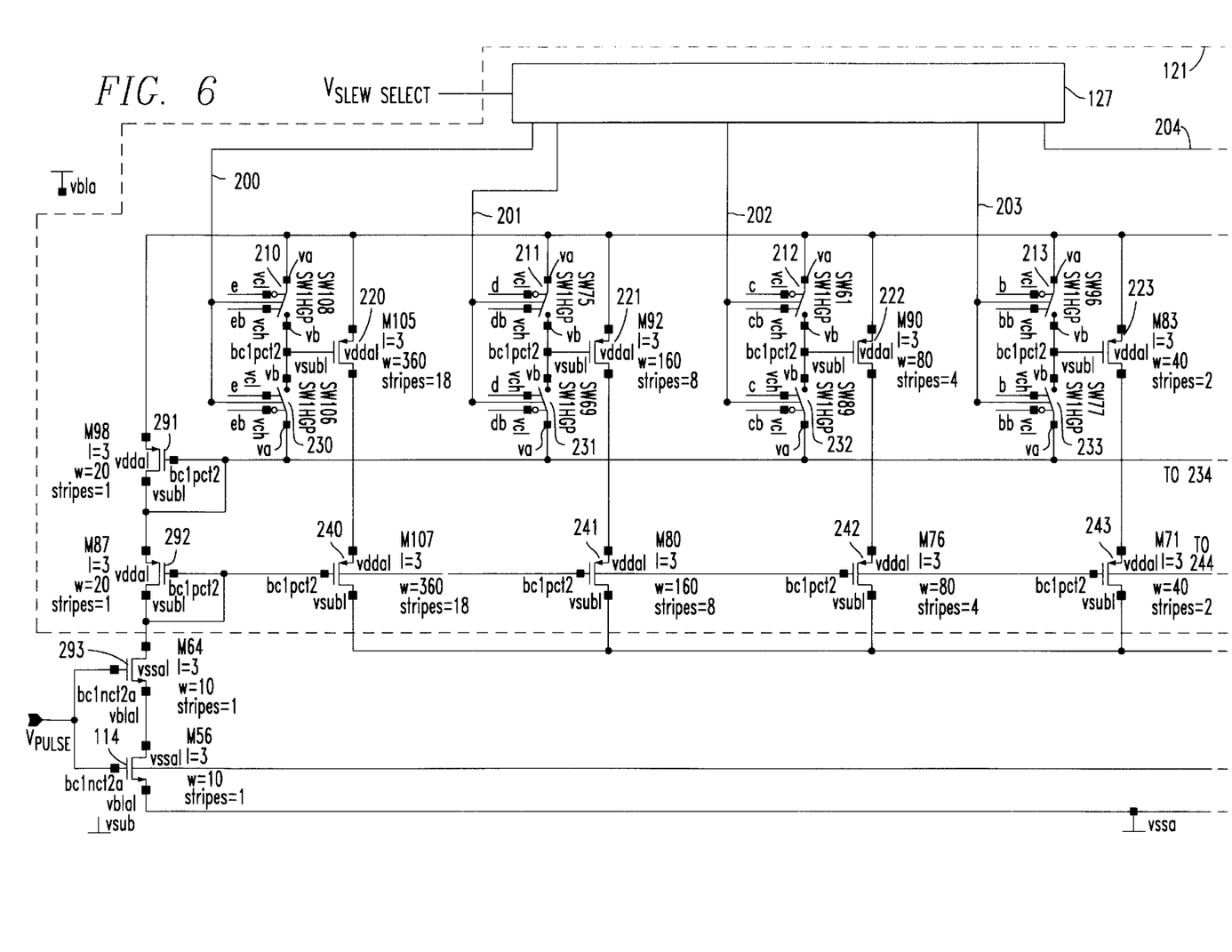
FIG. 6 is a schematic of the slew controlled amplifier of FIG. 5.
Figure 6A:
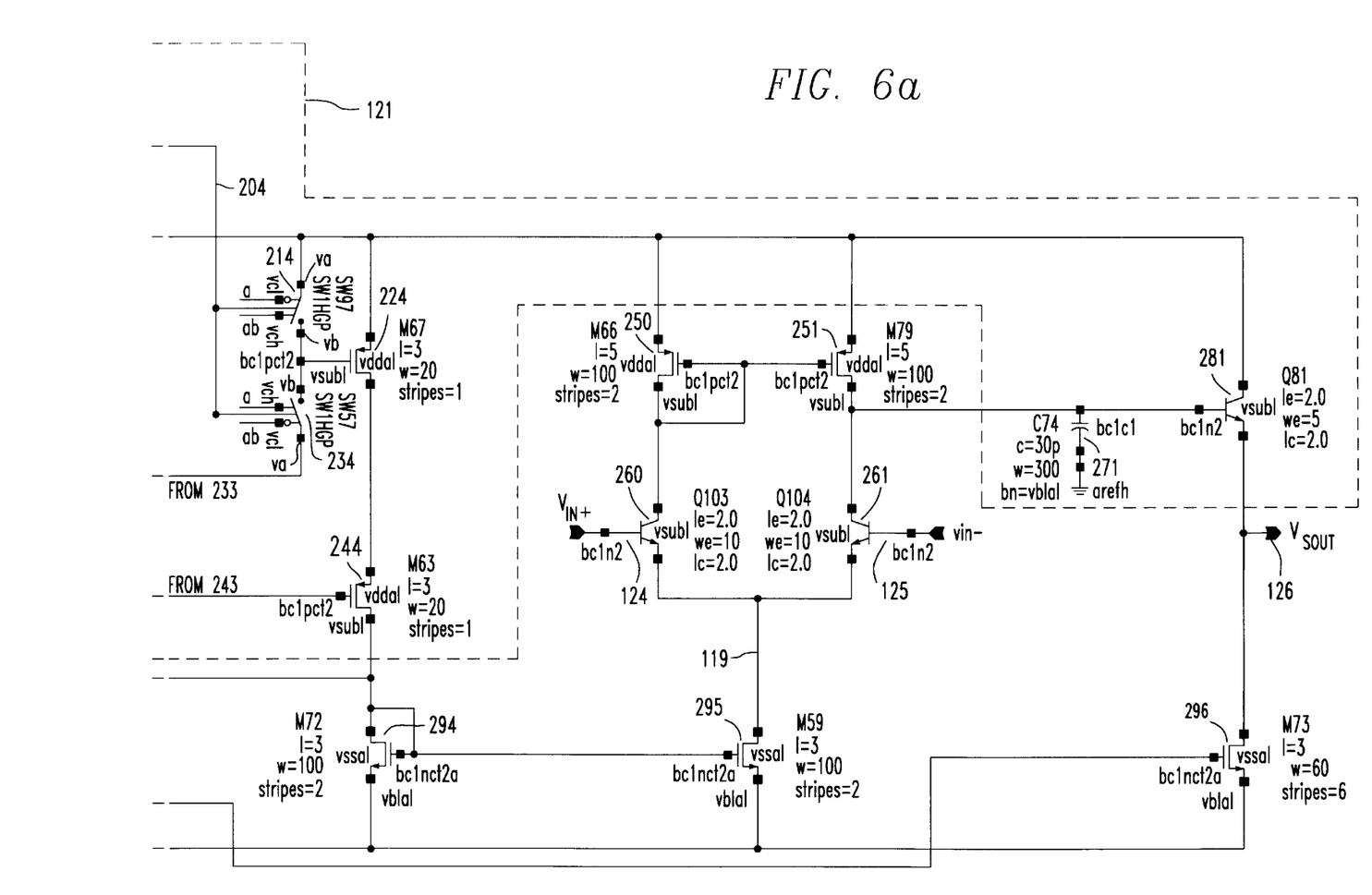

With reference to FIG. 6, the amplifier 120 is shown if further detail along with further details of the slew controller 121. As will be seen, slew controller 121 receives an input signal $V_{SLEW\ SELECT}$. The signal $V_{SLEW\ SELECT}$ is input to a suitable multiplexer 127. Multiplexer 127 has a plurality of output lines 200–204. Each output line controls two of the switches in the switch arrays 210–214 and 230–234. As such, multiplex line output 200 controls switches 210 and 230; line 201 controls switches 211 and 231, etc. The switches 210–214 and 230–234 control the amount of current passing through transistors 220–225. It will be seen that transistor 220 is coupled between its pair of control switches 210 and 230. Transistors 211–225 are likewise coupled between their respective pair of controls switches, from the remaining switches 211–215 and 231–235. The output currents of transistors 220–225 are summed by summing transistors 240–244. The summed currents are applied via transistors 294–295 as a control current signal 119 to the coupled emitters of a first differential pair of transistors 260, 261. A second differential pair of transistors 250, 251 has the gate of transistor 250 shorted to its drain and the drain of the other transistor 251 coupled to capacitor 271. As such, the current in transistor 295 controls how much current is drawn by the differential pair 260, 261 which make up the plus and minus inputs 124, 125 of the amplifier 120. That current is suitably controlled when the $V_{SLEW\ SELECT}$ signal applied to the multiplexer 127 which operates the switch arrays 210–214, 230–234, and transistors 220–224, 240–244. Thus, the current on line 119 controls the slew rate of the amplifier and it set by the signal $V_{SLEW\ SELECT}$.

Having thus disclosed the preferred embodiment of the invention, those skilled in the art will appreciate that further changes and modifications, additions and alterations may be made to that preferred embodiment without departing from the spirit and scope of the invention as set forth in the following claims:

What is claimed is:

1. A method for detecting the arrival time of each pulse signal in a sequence of pulse signals and limiting error induced by amplitude variations of the pulse signals comprising the steps of:

receiving an input signal of unknown amplitude;

providing an amplifier with a controllable slew rate for comparing the amplitude of the input signal to a predetermined threshold;

controlling slew rate of the amplifier so that the slew rate is less than the rate of change of signals of the largest amplitudes and sufficient to permit signals of a predetermined minimum amplitude to exceed the threshold;

measuring the time when the input signal crosses said predetermined threshold to determine the arrival time of said signal.

2. The method of claim 1 wherein the slew rate is a rate selected from a plurality of predetermined rates.

3. The method of claim 1 wherein the threshold is selected from a plurality of predetermined thresholds.

4. A pulse detector for detecting the arrival time of each pulse in a sequence of pulses and limiting error induced by amplitude variations of the pulses comprising:

an amplifier with a controllable slew rate for detecting when the amplitude of an input pulse crosses a predetermined threshold, said amplifier having an input for receiving input pulses of unknown amplitude;

a pulse time measurement circuit coupled to the amplifier for generating output signal representative of the arrival time of said input pulses;

a slew rate control circuit coupled to the amplifier to adjust the slew rate so that the slew rate is equal to or greater than the rate of change of pulses of the smallest desired detectable amplitudes.

5. The pulse detector of claim 4 wherein the pulse time measurement circuit comprises a counter for generating count pulses each of a predetermined pulse width.

6. The pulse detector of claim 4 wherein the slew rate control circuit comprises a network including a plurality of capacitors, a plurality of switches coupled to the capacitors, and means for selecting and operating the switches to select one or more capacitors.

7. A combined pulse detector and A/D converter comprising:

a first amplifier with a controllable slew rate for detecting when the amplitude of an input pulse crosses a predetermined threshold, said first amplifier having an input for receiving input pulses of unknown amplitude;

a pulse time measurement circuit coupled to the first amplifier for generating output signal representative of the arrival time of said input pulses;

a slew rate control circuit coupled to the first amplifier to adjust the slew rate so that the slew rate is equal to or greater than the rate of change of pulses of the smallest desired detectable amplitudes;

a second amplifier for receiving input pulses of unknown amplitude and having a reference input, a signal input, a bias input, a reset input, an output with an output signal when an input signal exceeds the reference input;

a hysteresis circuit coupled to the second amplifier for delaying the output of the second amplifier from falling when the input pulse falls below the reference input, said hysteresis circuit coupled to the reset input for receiving a reset signal to reset the output of the second amplifier before a subsequent input pulse is received.

8. A method for detecting the time of arrival and amplitude of a pulse comprising the steps of:

assynchronously applying a first high frequency pulse signal to an A/D converter;

comparing the amplitude of the pulse signal to a known reference signal with a hysteresis amplifier that delays an output of the hysteresis amplifier from following a falling input pulse and provides a digital output signal;

resetting the A/D converter after a period of time less than the period of the high frequency pulse signal;

providing a pulse detection amplifier with a controllable slew rate for comparing the amplitude of the input pulse to a predetermined threshold;

controlling slew rate of the pulse detection amplifier so that the slew rate is at least as high as the rate of change of signals of the smallest amplitudes expected to be detected by the pulse detection amplifier and sufficient to permit signals of a predetermined minimum amplitude to exceed the threshold;

measuring the time when the input pulse crosses said predetermined threshold to determine the arrival time of said signal;

providing an output signal representative of the amplitude and the time of arrival of the input pulse.

\* \* \* \* \*